United States Patent
Pant et al.

(10) Patent No.: US 10,103,719 B2
(45) Date of Patent: Oct. 16, 2018

(54) INTEGRATED VOLTAGE REGULATOR WITH IN-BUILT PROCESS, TEMPERATURE AND AGING COMPENSATION

(71) Applicant: Nvidia Corporation, Santa Clara, CA (US)

(72) Inventors: Sanjay Pant, Sunnyvale, CA (US); Tezaswi Raja, San Jose, CA (US); Andy Charnas, San Jose, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 14/856,191

(22) Filed: Sep. 16, 2015

(65) Prior Publication Data

US 2017/0075402 A1 Mar. 16, 2017

(51) Int. Cl.
| | |
|---|---|
| G06F 1/26 | (2006.01) |
| H03K 7/06 | (2006.01) |
| H03L 7/06 | (2006.01) |
| H03K 5/14 | (2014.01) |
| H03K 7/08 | (2006.01) |
| G06F 1/04 | (2006.01) |
| H03K 5/00 | (2006.01) |

(52) U.S. Cl.
CPC ............ H03K 5/14 (2013.01); G06F 1/04 (2013.01); G06F 1/26 (2013.01); H03K 7/08 (2013.01); H03L 7/06 (2013.01); *H03K 2005/00019* (2013.01)

(58) Field of Classification Search
CPC .. G06F 1/10; G06F 1/266; H03K 5/14; H03K 7/08; H03L 7/06

USPC ........................................ 713/300, 320, 600
See application file for complete search history.

(56) References Cited

U.S. PATENT DOCUMENTS

| | | | |
|---|---|---|---|
| 4,958,269 | A | 9/1990 | Gritter |
| 5,430,394 | A | 7/1995 | McMinn et al. |
| 5,553,276 | A | 9/1996 | Dean |
| 5,690,139 | A | 11/1997 | Murphy et al. |
| 5,691,662 | A | 11/1997 | Soboleski et al. |

(Continued)

FOREIGN PATENT DOCUMENTS

| | | |
|---|---|---|
| CN | 101505100 | 8/2009 |
| CN | 104320134 | 1/2015 |
| TW | 591866 | 6/2004 |

OTHER PUBLICATIONS

Park, Junyoung, et al.,"A Fast, Accurate and Simple Critical Path Monitor for Improving Energy-Delay Product in DVS Systems," IEEE, Jan. 2011, pp. 391-396.

(Continued)

*Primary Examiner* — Mark Connolly

(57) ABSTRACT

A method for regulating voltage for a processor is disclosed. The method comprises requesting a target frequency value, wherein the target frequency value determines a target clock frequency for clocking the processor. The method also comprises comparing the target clock frequency to a first signal to generate an error signal. Further, the method comprises using the error signal to generate a duty cycle control signal, wherein the duty cycle control signal is operable to generate a periodic waveform. Finally, the method comprises generating an output regulator voltage using the periodic waveform, wherein the output voltage is operable to provide power to the processor.

14 Claims, 8 Drawing Sheets

(56) References Cited

U.S. PATENT DOCUMENTS

| | | | |
|---|---|---|---|
| 5,787,006 A | 7/1998 | Chevallier et al. | |
| 5,842,001 A | 11/1998 | Kubota | |
| 5,905,867 A * | 5/1999 | Giorgio | G06F 11/3006 709/224 |
| 6,080,206 A | 6/2000 | Tadokoro et al. | |
| 6,111,756 A | 8/2000 | Moresco | |
| 6,125,157 A | 9/2000 | Donnelly et al. | |
| 6,157,247 A | 12/2000 | Abdesselem et al. | |
| 6,198,635 B1 | 3/2001 | Shenoy et al. | |
| 6,397,375 B1 | 5/2002 | Block et al. | |
| 6,414,527 B1 | 7/2002 | Seno et al. | |
| 6,535,071 B2 | 3/2003 | Forbes | |
| 6,734,744 B2 | 5/2004 | Monzel et al. | |
| 6,816,978 B1 * | 11/2004 | Kaminski | H02M 1/15 307/31 |
| 6,825,732 B2 * | 11/2004 | Motoyama | H03K 3/0315 331/177 R |
| 6,831,494 B1 | 12/2004 | Fu et al. | |
| 6,882,172 B1 | 4/2005 | Suzuki et al. | |
| 6,885,210 B1 | 4/2005 | Suzuki | |
| 6,898,770 B2 | 5/2005 | Boluki et al. | |
| 6,903,564 B1 | 6/2005 | Suzuki | |
| 6,985,025 B1 | 1/2006 | Maksimovic et al. | |
| 7,024,568 B2 | 4/2006 | Maksimovic et al. | |
| 7,038,483 B1 | 5/2006 | Suzuki et al. | |
| 7,049,873 B2 | 5/2006 | Pilo et al. | |
| 7,061,292 B2 | 6/2006 | Maksimovic et al. | |
| 7,085,658 B2 | 8/2006 | Bhushan et al. | |
| 7,095,288 B2 | 8/2006 | Smith | |
| 7,107,200 B1 | 9/2006 | Korobkov | |
| 7,126,365 B2 | 10/2006 | Suzuki | |
| 7,129,763 B1 | 10/2006 | Bennett et al. | |
| 7,149,903 B1 | 12/2006 | Chan et al. | |
| 7,151,417 B1 | 12/2006 | Suzuki | |
| 7,161,812 B1 | 1/2007 | Thomas | |
| 7,212,022 B2 | 5/2007 | Suzuki | |
| 7,235,998 B1 | 6/2007 | Suzuki | |
| 7,242,733 B2 | 7/2007 | Iwata | |
| 7,279,938 B1 | 10/2007 | Lin | |
| 7,281,232 B1 | 10/2007 | Nicolino, Jr. et al. | |
| 7,310,008 B1 | 12/2007 | Masleid | |
| 7,315,178 B1 | 1/2008 | Suzuki | |
| 7,330,080 B1 | 2/2008 | Stoiber et al. | |
| 7,332,931 B1 | 2/2008 | Masleid | |
| 7,414,485 B1 | 8/2008 | Masleid | |
| 7,417,482 B2 | 8/2008 | Elgebaly et al. | |
| 7,441,137 B1 * | 10/2008 | Mimberg | G05F 1/462 713/300 |
| 7,454,674 B2 | 11/2008 | Hess et al. | |
| 7,454,735 B2 | 11/2008 | Arthanari et al. | |
| 7,456,628 B2 | 11/2008 | Suzuki | |
| 7,467,367 B1 | 12/2008 | Li et al. | |
| 7,501,868 B2 | 3/2009 | Ito | |
| 7,592,842 B2 | 9/2009 | Masleid | |
| 7,602,166 B1 * | 10/2009 | Kang | H02M 3/157 323/283 |
| 7,636,023 B1 | 12/2009 | Suzuki | |
| 7,642,825 B2 | 1/2010 | Maeda | |
| 7,642,866 B1 | 1/2010 | Masleid | |
| 7,656,212 B1 | 2/2010 | Masleid | |
| 7,667,478 B2 | 2/2010 | Suzuki | |
| 7,724,025 B2 | 5/2010 | Masleid | |
| 7,768,356 B2 | 8/2010 | Masleid | |
| 7,774,732 B2 | 8/2010 | KleinOsowski et al. | |
| 7,849,332 B1 * | 12/2010 | Alben | G06F 1/206 713/300 |
| 7,868,638 B2 | 1/2011 | Suzuki | |
| 7,882,369 B1 * | 2/2011 | Kelleher | G06F 1/3203 345/419 |
| 7,889,014 B1 | 2/2011 | Stoiber et al. | |
| 8,008,961 B2 | 8/2011 | Garg et al. | |
| 8,125,261 B2 | 2/2012 | Nomura | |
| 8,134,356 B2 | 3/2012 | Dobberpuhl et al. | |
| 8,183,899 B2 | 5/2012 | Kanno et al. | |
| 8,549,363 B2 * | 10/2013 | Cher | G01R 31/31725 702/182 |
| 8,593,197 B1 | 11/2013 | Cheng | |
| 8,624,680 B2 | 1/2014 | Stoiber et al. | |
| 8,680,905 B1 | 3/2014 | Nagarajan et al. | |
| 8,943,242 B1 | 1/2015 | Gibson et al. | |
| 8,963,600 B2 | 2/2015 | Mann | |
| 9,092,048 B1 * | 7/2015 | Owen | G06F 1/00 |
| 9,195,246 B2 * | 11/2015 | Kahn | G05F 1/46 |
| 9,312,863 B2 | 4/2016 | Sippel | |
| 2002/0188920 A1 | 12/2002 | Lampaert et al. | |
| 2003/0030483 A1 | 2/2003 | Seki et al. | |
| 2004/0078773 A1 | 4/2004 | Sharma et al. | |
| 2004/0123171 A1 | 6/2004 | Zhang et al. | |
| 2004/0263212 A1 * | 12/2004 | Wald | G06F 1/04 327/40 |
| 2005/0012556 A1 | 1/2005 | Bhushan et al. | |
| 2005/0036246 A1 | 2/2005 | Nagata et al. | |
| 2005/0097497 A1 | 5/2005 | Schlansker et al. | |
| 2006/0031699 A1 | 2/2006 | Arthanari et al. | |
| 2006/0097795 A1 | 5/2006 | Sohn | |
| 2006/0156266 A1 | 7/2006 | Alpert et al. | |
| 2006/0288323 A1 | 12/2006 | Birch | |
| 2007/0157144 A1 | 7/2007 | Mai et al. | |
| 2007/0186123 A1 * | 8/2007 | Winbom | G06F 1/3203 713/322 |
| 2008/0204158 A1 | 8/2008 | Weder | |
| 2008/0229127 A1 * | 9/2008 | Felter | G06F 1/3203 713/320 |
| 2009/0271752 A1 | 10/2009 | Alpert et al. | |
| 2010/0019834 A1 | 1/2010 | Zerbe et al. | |
| 2010/0164585 A1 | 7/2010 | Romani et al. | |
| 2010/0231306 A1 | 9/2010 | Goodnow et al. | |
| 2011/0140752 A1 | 6/2011 | Garg et al. | |
| 2011/0161901 A1 | 6/2011 | Berry et al. | |
| 2011/0199159 A1 | 8/2011 | Rozen et al. | |
| 2012/0013408 A1 | 1/2012 | Cortadella et al. | |
| 2013/0009700 A1 * | 1/2013 | Deboy | H02J 3/383 327/581 |
| 2013/0047023 A1 | 2/2013 | Penzes et al. | |
| 2013/0152035 A1 | 6/2013 | Berry et al. | |
| 2013/0185584 A1 * | 7/2013 | Hirairi | G06F 1/12 713/502 |
| 2013/0311799 A1 | 11/2013 | Fitzpatrick et al. | |
| 2014/0176116 A1 * | 6/2014 | Kumar | G01R 31/2858 324/76.41 |
| 2015/0008987 A1 | 1/2015 | Bollapalli et al. | |
| 2015/0022272 A1 * | 1/2015 | Felix | G06F 1/08 331/17 |
| 2016/0380619 A1 | 12/2016 | Bollapalli et al. | |
| 2017/0012584 A1 | 1/2017 | Lee et al. | |
| 2017/0075402 A1 | 3/2017 | Pant et al. | |

OTHER PUBLICATIONS

Stiles, Jim, "10.3 CMOS Logic Gate Circuits," The University of Kansas, Dept of EECS, Retrieved From http://www.ittc.ku.edu/~jstiles/312/handouts/section_10_3_CMOS_Logic_Gate_Circuits_package.pdf, Nov. 14, 2004, pp. 1-22.

Texas Instruments Application Report—Designing Fast Response Synchronous Buck Regulators Using the TSP5210 (http://www.ti.com/lit/an/slva044/slva044. pdf).

* cited by examiner

INTEGRATED VOLTAGE REGULATOR WITH IN-BUILT PROCESS, TEMPERATURE AND AGING COMPENSATION

CROSS-REFERENCE TO RELATED APPLICATIONS

Related Applications

The present application is related to co-pending U.S. patent application Ser. No. 13/947,999, filed Jul. 22, 2013, entitled "CLOSED LOOP DYNAMIC VOLTAGE AND FREQUENCY SCALING," naming Stephen Felix, Jeffery Bond, Tezaswi Raja, Kalyana Bollapalli and Vikram Mehta as inventors. That application is incorporated herein by reference in its entirety and for all purposes. The present application is also related to the following co-pending U.S. Patent Application: U.S. patent application Ser. No. 14/323,787, filed Jul. 3, 2014, entitled "CLOCK GENERATION CIRCUIT THAT TRACKS CRITICAL PATH ACROSS PROCESS, VOLTAGE AND TEMPERATURE VARIATION," naming Kalyana Bollapalli and Tezaswi Raja as inventors, which is incorporated herein by reference in its entirety and for all purposes.

FIELD OF THE INVENTION

Embodiments according to the present invention generally relate to power delivery and more specifically to voltage regulators for supplying power to microprocessors.

BACKGROUND

The power delivery of a microprocessor typically consists of an off-chip voltage regulator (VRM) to supply power to the on-chip devices. Typically, the supply voltage to the on-chip devices is not ideal and can exhibit temporal variations with varying frequency content (~1 KHz to >1 GHz) due to sudden changes in circuit activity within the microprocessor as shown in FIGS. 1A and 1B. FIG. 1A illustrates a frequency response of a typical microprocessor power delivery network while FIG. 1B illustrates a transient response of a typical microprocessor power delivery network. The typical off-chip voltage regulator module typically does not have bandwidth high enough to suppress the voltage variations with frequency content above ~1 MHz, even in the presence of decoupling capacitors at various locations in the power delivery network (PDN).

A typical microprocessor system consists of many different voltage domains that generally require many different VRMs (or multiple-output VRMs) and a large number of off-chip components, which consume valuable board area. Accordingly, having several different voltage regulator modules on dedicated dies is inefficient. Furthermore, efficient dynamic voltage and frequency scaling (DVFS) requires a fast voltage transition time which is limited to approximately 10 mV/ms from off-chip VRMs.

Another shortcoming of conventional voltage regulators is that the regulated voltage is independent of the environment variations that the on-chip devices may experience during the course of operation. For example, temperature variations and aging effects can influence the speed of on-chip devices significantly at run-time and can cause functional failures. Conventional regulators are not designed to accommodate variations in activity, temperature and aging and are, therefore, unsuited for modern high performance microprocessor systems.

BRIEF SUMMARY

Accordingly, a need exists for an integrated voltage regulation system that is digitally controlled and can compensate for voltage fluctuation, process variation, temperature variation and aging. In one embodiment of the present invention all or part of the voltage regulator module is integrated on the same die as the processor (or the load) and digitally controlled using a desired frequency of operation as an input parameter. Further, in one embodiment of the present invention, the digitally controlled voltage regulator of the present invention advantageously generates the minimum supply voltage required for current operation at the target frequency. This, in general, results in higher energy efficiency and battery life.

Additionally, in one embodiment, the voltage regulator of the present invention compensates for critical path delay variations due to changes in temperature during runtime and for critical path delay increases due to transistor speed degradation due to aging. This also results in higher energy efficiency and improved battery life for mobile applications.

It should be noted that while some prior art systems employ temperature and aging compensator circuits in series with the voltage regulator module, embodiments of the present invention are more area-efficient as they incorporate these compensator circuits in the feedback loop in the voltage regulator module (VRM), which obviates the need of an area-intensive A/D converter. Having the compensator in the feedback loop of the regulator also results in lower latency of compensation.

In one embodiment, a method for regulating voltage for a processor is disclosed. The method comprises requesting a target frequency value, wherein the target frequency value determines a target clock frequency for clocking a processor. The method also comprises comparing the target clock frequency to a first signal to generate an error signal. Further, the method comprises using the error signal to generate a duty cycle control signal, wherein the duty cycle control signal is operable to generate a periodic waveform. The method also comprises generating an output regulator voltage using the periodic waveform, wherein the output voltage is operable to provide power to the processor.

In one embodiment, an apparatus for regulating processor voltage is disclosed. The apparatus comprises a comparator, having a first input operable to be set at a target frequency value, and wherein the target frequency value determines a target clock frequency for clocking a processor. The apparatus also comprises a dynamic voltage controlled oscillator (DVCO) operable to generate a clock signal with a first frequency, wherein the first frequency is an operating frequency of the processor and is a second input to the comparator, wherein the first frequency is a function of the output regulator voltage, wherein the DVCO is powered by the output regulator voltage, and wherein the first frequency is compared with the target clock frequency using the comparator to generate an error signal. Further, the apparatus comprises a circuit operable to generate an output regulator voltage using the error signal, wherein the output regulator voltage is operable to supply power to the processor.

In a different embodiment, an apparatus for regulating a processor voltage is disclosed, wherein the apparatus comprises a plurality of critical path monitoring circuits operating at an output regulator voltage. The apparatus also comprises a plurality of phase detectors operable to compare a plurality of delay values corresponding to the plurality of critical path monitoring circuits to a target clock frequency in order to generate an error signal, wherein each of the plurality of delay values represents a critical path delay for a respective critical path of a processor. Finally, the apparatus comprises a circuit operable to generate the output regulator voltage using the error signal, wherein the output regulator voltage is operable to provide power to the processor.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Figure 1B:
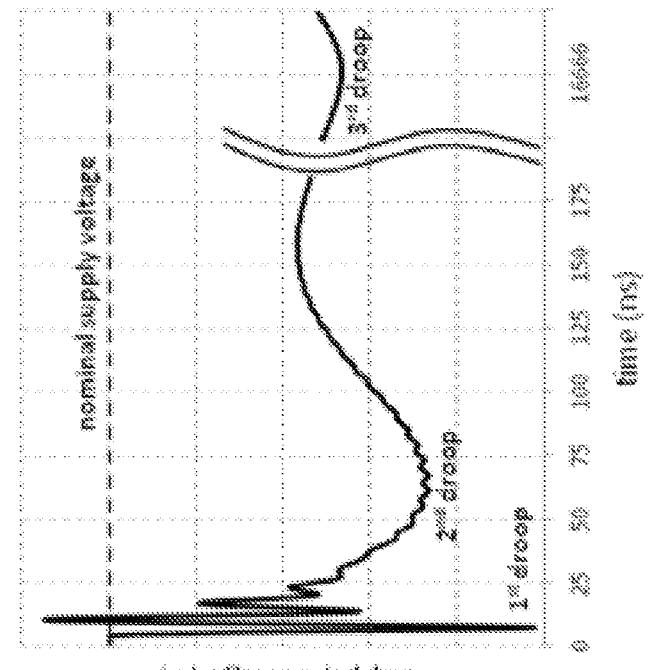
FIG. 1B illustrates a transient response of a typical microprocessor power delivery network.
Figure 1A:
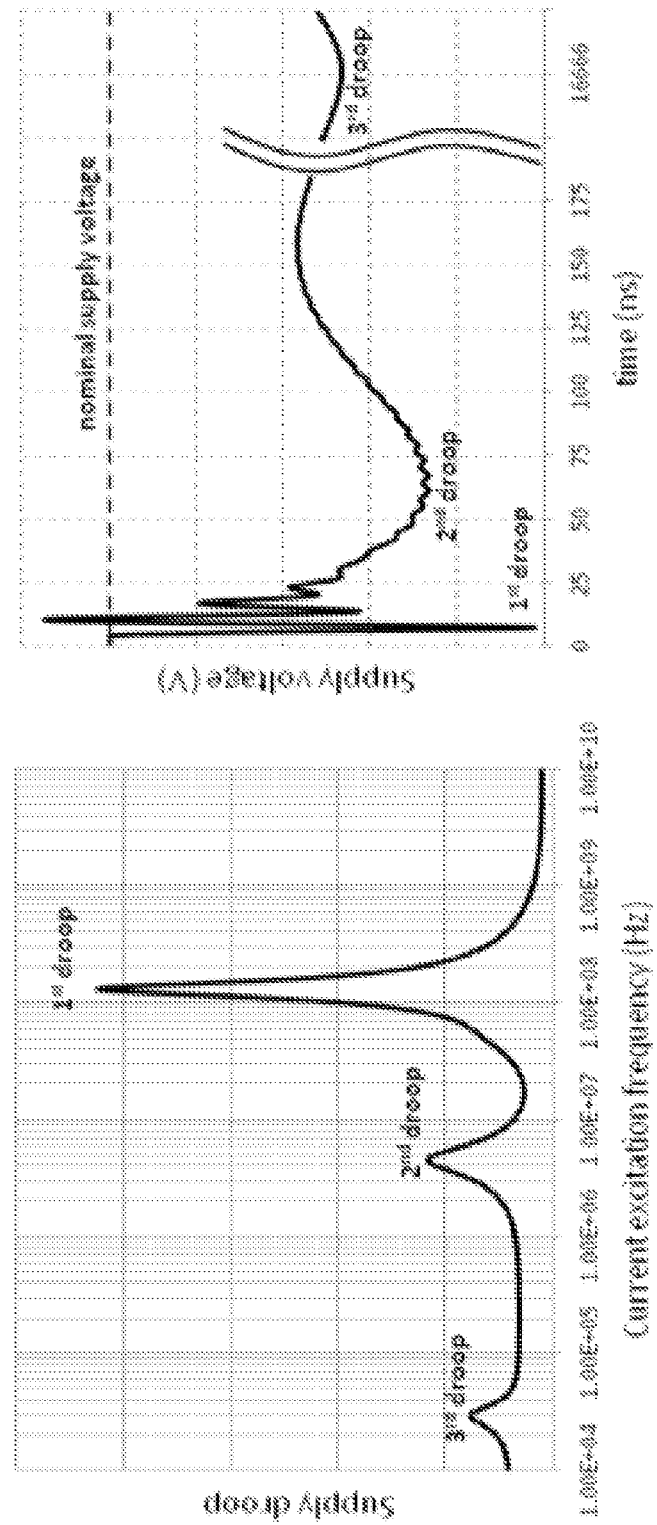
FIG. 1A illustrates a frequency response of a typical microprocessor power delivery network.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "requesting," "comparing," "generating," or the like, refer to actions and processes (e.g., flowchart 800 of FIG. 8) of a computer system or similar electronic computing device or processor (e.g., system 110 of FIG. 2). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can be accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

Figure 2:
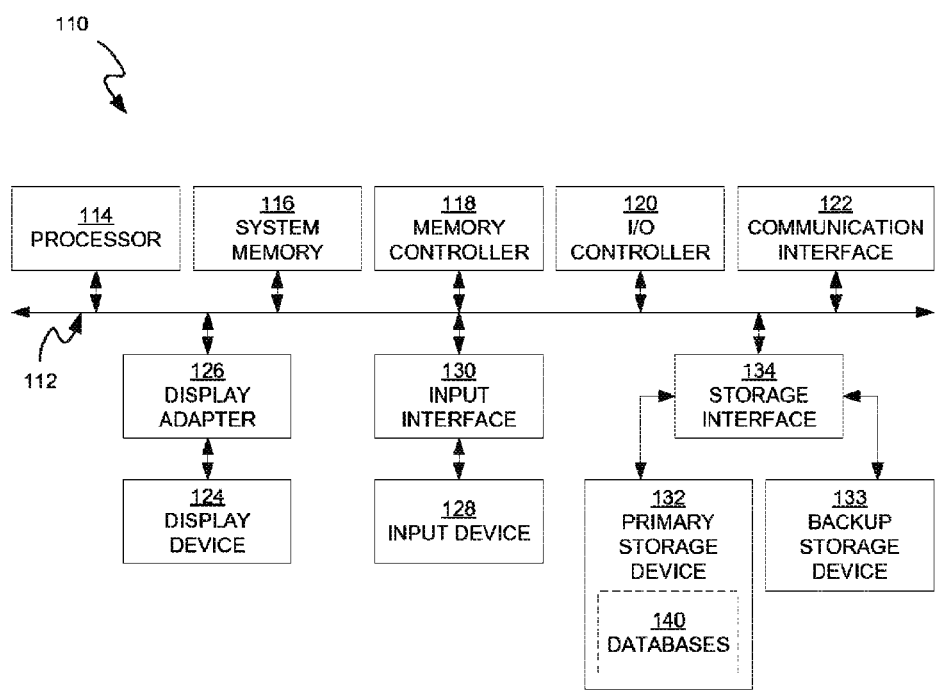
FIG. 2 is a block diagram of an example of a computing system capable of implementing embodiments of the present invention.

FIG. 2 is a block diagram of an example of a computing system 110 capable of implementing embodiments of the present disclosure. Computing system 110 broadly represents any single or multi-processor computing device or system capable of executing computer-readable instructions. Examples of computing system 110 include, without limitation, workstations, laptops, client-side terminals, servers, distributed computing systems, handheld devices, or any other computing system or device. In its most basic configuration, computing system 110 may include at least one processor 114 and a system memory 116.

Processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein. In one embodiment, the power delivery network of computing system 110 uses the voltage regulating mechanism of the present invention to supply power to the processor 114 and on-chip devices included therein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments computing system 110 may include both a volatile memory unit (such as, for example, system memory 116) and a non-volatile storage device (such as, for example, primary storage device 132).

Computing system 110 may also include one or more components or elements in addition to processor 114 and system memory 116. For example, in the embodiment of FIG. 2, computing system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of computing system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of computing system 110, such as processor 114, system memory 116, communication interface 122, display adapter 126, input interface 130, and storage interface 134.

Communication interface 122 broadly represents any type or form of communication device or adapter capable of facilitating communication between example computing system 110 and one or more additional devices. For example, communication interface 122 may facilitate communication between computing system 110 and a private or public network including additional computing systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between computing system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow computing system 110 to engage in distributed or remote computing. For example, communication interface 122 may receive instructions from a remote device or send instructions to a remote device for execution.

As illustrated in FIG. 2, computing system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 2, computing system 110 may also include at least one input device 128 coupled to communication infrastructure 112 via an input interface 130. Input device 128 generally represents any type or form of input device capable of providing input, either computer- or human-generated, to computing system 110. Examples of input device 128 include, without limitation, a keyboard, a pointing device, a speech recognition device, or any other input device.

As illustrated in FIG. 2, computing system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of computing system 110.

In one example, databases 140 may be stored in primary storage device 132. Databases 140 may represent portions of a single database or computing device or it may represent multiple databases or computing devices. For example, databases 140 may represent (be stored on) a portion of computing system 110 and/or portions of example network architecture 200 in FIG. 2 (below). Alternatively, databases 140 may represent (be stored on) one or more physically separate devices capable of being accessed by a computing device, such as computing system 110 and/or portions of network architecture 200.

Continuing with reference to FIG. 2, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into computing system 110. For example, storage devices 132 and 133 may be configured to read and write software, data, or other computer-readable information. Storage devices 132 and 133 may also be a part of computing system 110 or may be separate devices accessed through other interface systems.

Many other devices or subsystems may be connected to computing system 110. Conversely, all of the components and devices illustrated in FIG. 2 need not be present to practice the embodiments described herein. The devices and subsystems referenced above may also be interconnected in different ways from that shown in FIG. 2. Computing system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 110. All or a portion of the computer program stored on the computer-readable medium may then be stored in system memory 116 and/or various portions of storage devices 132 and 133. When executed by processor 114, a computer program loaded into computing system 110 may cause processor 114 to perform and/or be a means for performing the functions of the example embodiments described and/or illustrated herein. Additionally or alternatively, the example embodiments described and/or illustrated herein may be implemented in firmware and/or hardware.

For example, a computer program running on processor 114 may request a different frequency than the one processor 114 is currently running on in which case the computer program would make a frequency request from the voltage regulating embodiment of the present invention, which will in turn vary the voltage that processor 114 is running on to accommodate the higher frequency request.

Integrated Voltage Regulator with in-Built Process, Temperature and Aging Compensation Embodiments of the present invention provide an integrated voltage regulation system that is digitally controlled and can compensate for voltage fluctuations, process variations, temperature variations and aging. In one embodiment of the present invention all or part of the voltage regulator module is integrated on the same die as the processor (or the load) and digitally controlled using a desired frequency of operation as an input parameter. In this embodiment, the digitally controlled voltage regulator of the present invention eliminates using a voltage identification code as an input parameter and instead uses the desired frequency of operation as the input parameter to the regulator control logic.

Further, in one embodiment of the present invention, the digitally controlled voltage regulator of the present invention optimally generates the minimum supply voltage required for operation at the target frequency. This, in general, results in higher energy efficiency and battery life.

Further, in one embodiment, the voltage regulator of the present invention advantageously compensates for critical path delay variations due to changes in temperature during runtime and for critical path delay increases due to transistor speed degradation due to aging. This also results in higher energy efficiency and improved battery life.

Figure 3:
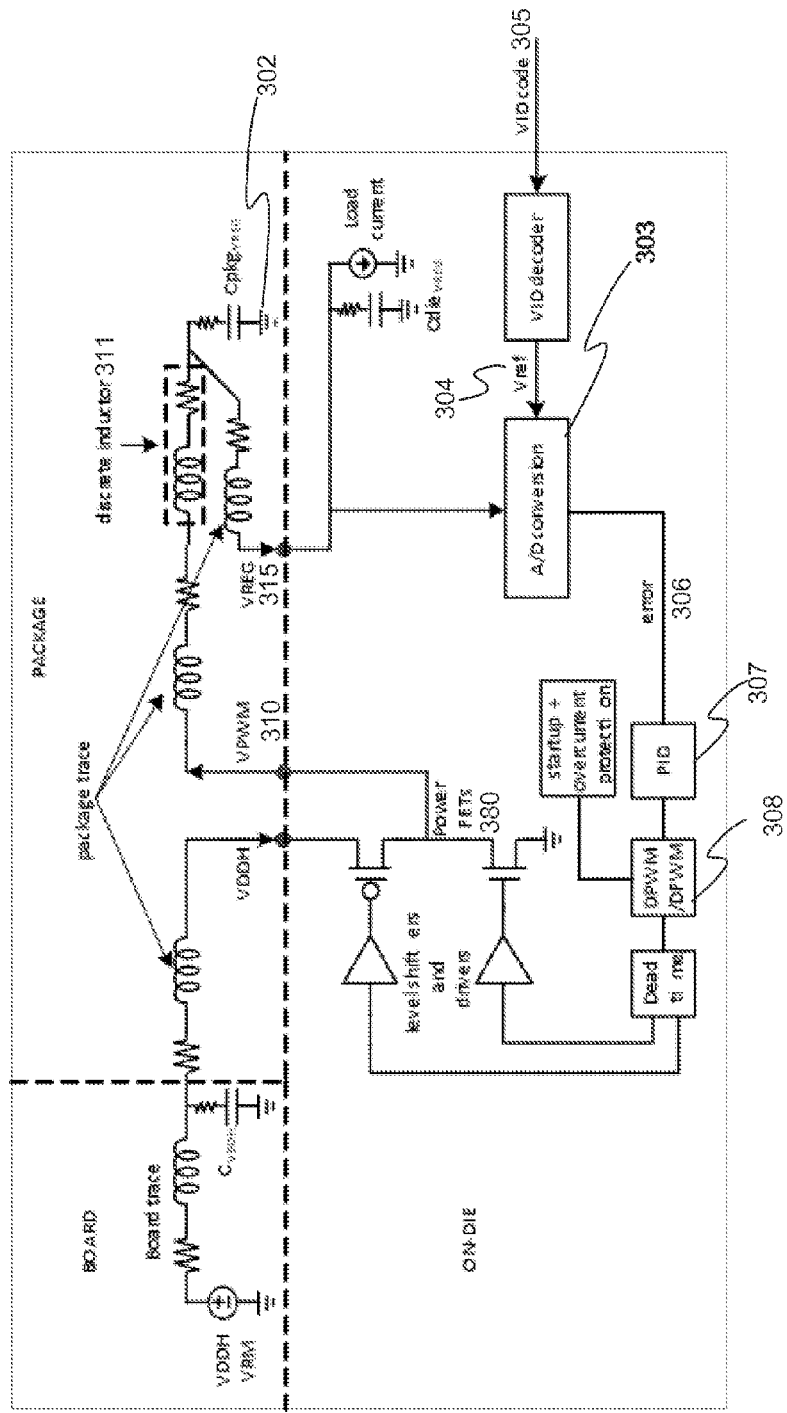
FIG. 3 is a conventional voltage regulator with digital control.
Figure 4:
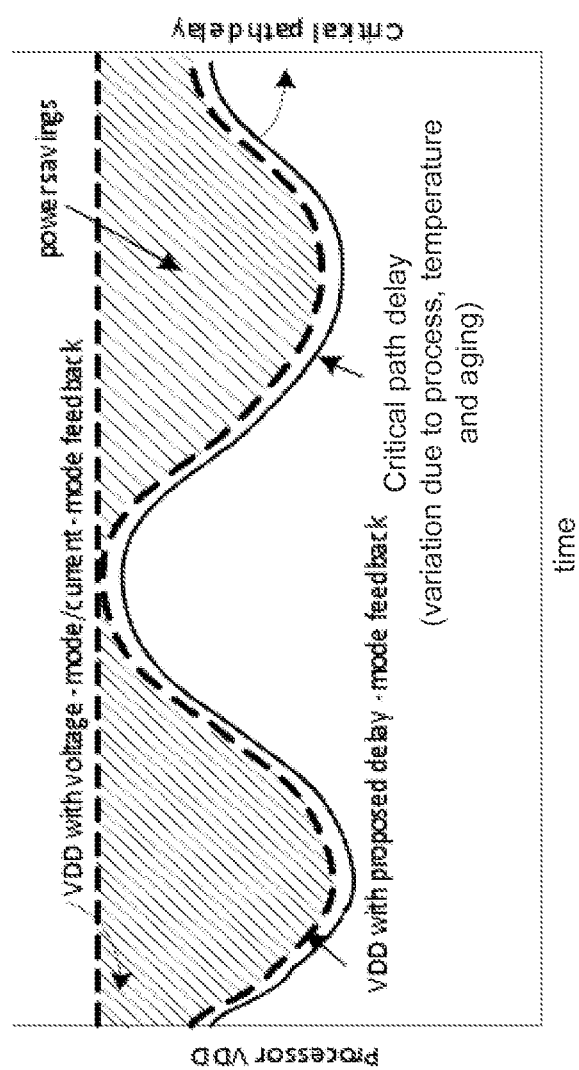
FIG. 4 illustrates a voltage guard-band for temperature and aging in a system with conventional integrated voltage regulators.

FIG. 3 is a conventional voltage regulator with digital control. Integrated voltage regulators (IVRs) integrate all or part of the VRM functionality on the same die as the load. A typical single-phase IVR system with in-package discrete inductors and on-chip control logic is shown in FIG. 4 (ground 302 has been idealized for clarity). Multiple such IVRs are used to power different voltage domains with improved transient response time, reduced board area and reduced board component cost, and increased efficient dynamic voltage and frequency scaling (DVFS). The control logic of an IVR can be implemented with analog or digital/semi-digital circuits.

A digital control based solution as shown in FIG. 3, comprises an analog-to-digital (A/D) converter 303, which samples the output regulated voltage and compares it to a reference voltage. The reference voltage 304 is derived from a voltage identification code (VID) 305 and determines the nominal output voltage of the VRM. The error signal 306 from the A/D converter is compensated through a PID 307 controller to generate a duty cycle control signal which is fed to a digital pulse-width modulation block (DPWM) 308 to generate a periodic waveform (VPWM) 310 with the desired duty cycle using the Power FETs 380. VPWM is used to switch the discrete inductor 311 periodically to either a high-voltage (VDDH) or ground to generate the desired output voltage, VREG 315.

The challenge with conventional off-chip or integrated voltage regulator modules such as the one illustrated in FIG. 3 is that they aim to generate a regulated voltage with minimum deviation from the desired VID code 305 and the generated regulated voltage is independent of the environment variations that the on-chip devices may experience during the course of the operation. However, temperature variations and aging effects can influence the speed of the on-chip devices significantly at runtime and can cause functional failures.

FIG. 4 illustrates a voltage guard-band for temperature and aging in a system with conventional integrated voltage regulators. A voltage guard-band is typically added for temperature, process and aging variations to ensure correct functioning of the logic in all conditions. Critical path delay is the minimum clock period needed for the processor to function without having a failure. As shown in the Figure, the critical path delay changes across time due to changes in voltage, temperature and aging. Since the critical path delay is tied to the voltage, the voltage required to function at a given critical path delay also changes with time as shown. In a conventional voltage regulator, the voltage has to be set such that the voltage is sufficient to meet the worst critical path delay. When the critical path delay is not at the worst value, then the excess voltage is known as voltage guard-band. This added guard-band (as shown in FIG. 4) in a traditional current-mode or voltage-mode feedback regulator causes power loss which affects average power and degrades battery life. The proposed embodiments of the present invention will make the voltage change track the changes in critical path delay as shown in FIG. 4. Accordingly, embodiments of the present invention provide a voltage regulating module that compensates for process variation, temperature variation, aging and voltage noise thereby improving energy efficiency.

Figure 5:
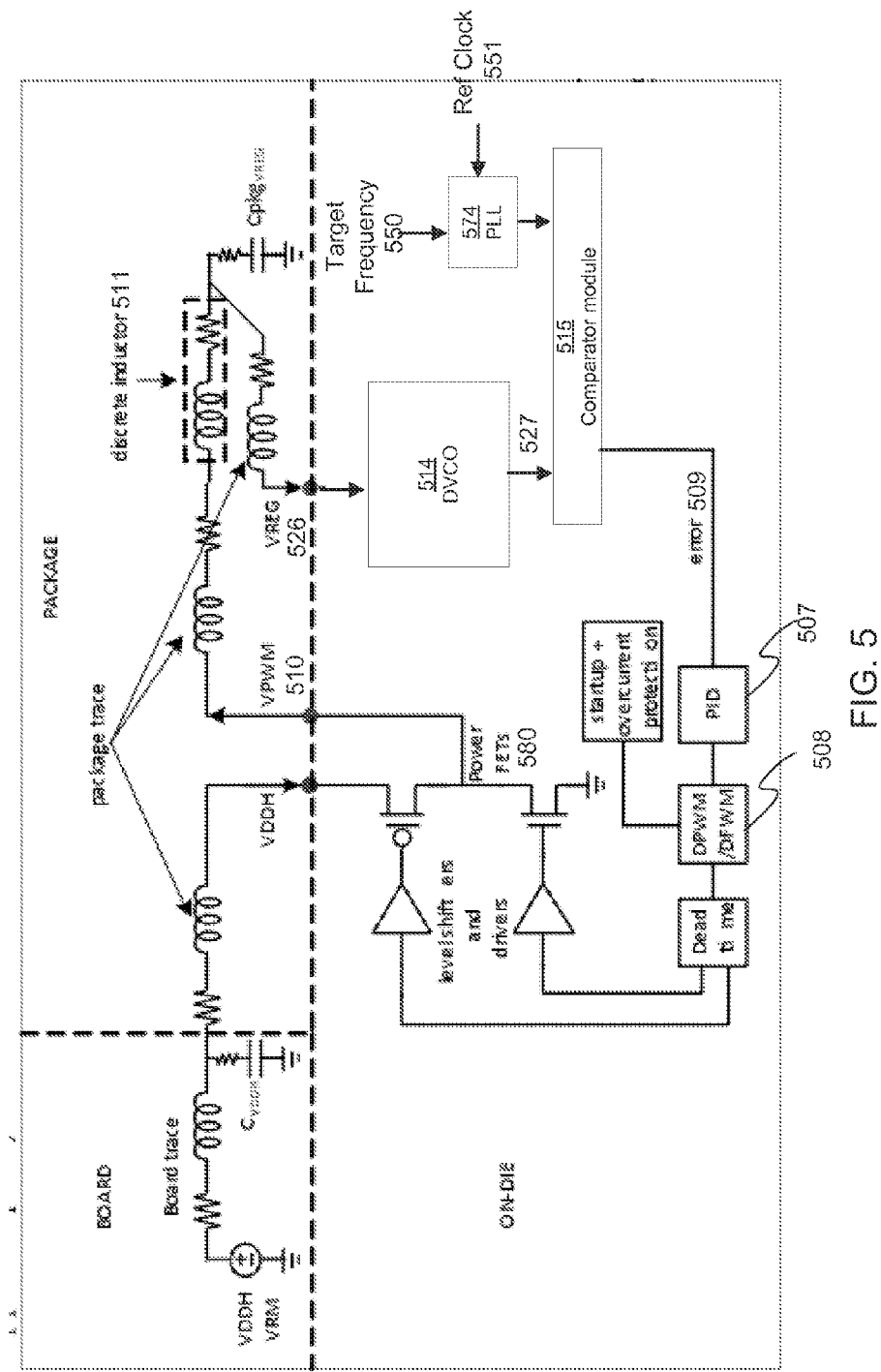
FIG. 5 illustrates a process, temperature, voltage, voltage noise and aging tolerant feedback control for voltage regulators using a dynamic voltage controlled oscillator in accordance with an embodiment of the present invention.

FIG. 5 illustrates a process, temperature, voltage, voltage noise and aging tolerant feedback control for voltage regulators using a dynamic voltage controlled oscillator in accordance with an embodiment of the present invention. The advantage of the circuit shown in FIG. 5 is that it compensates for voltage noise in addition to process, temperature and aging variations, e.g., the circuit in FIG. 5 is efficient in reacting to fast changing noise caused due a change in current being drawn from the regulator, for instance, when a CPU or GPU changes its current draw quickly.

Power supply noise has been a major issue for chips designed in recent years. In the worst case, power supply noise limits the maximum frequency that the chip can achieve and this reduces the effective performance of the product even though the worst case noise events are extremely rare. To overcome this problem, embodiments of the present invention use elastic clocking techniques where the clock generator is a Dynamic voltage Controlled Oscillator (DVCO) 514 (as discussed in related U.S. patent application Ser. No. 14/323,787, filed Jul. 3, 2014, entitled "CLOCK GENERATION CIRCUIT THAT TRACKS CRITICAL PATH ACROSS PROCESS, VOLTAGE AND TEMPERATURE VARIATION," naming Kalyana Bollapalli and Tezaswi Raja as inventors, hereinafter referred to as "the DVCO application" which is incorporated herein by reference) which is connected to the same voltage supply as the chip consuming the clock. In this circuit, during a noise event when the voltage drops, the DVCO reduces clock frequency also to avoid the chip from failing. This happens only when there is a noise event. The rest of the time when there is no noise event, the chip runs at a higher effective frequency and performance. Accordingly, the design illustrated in FIG. 5 results in higher performance and power improvement.

As explained above, application of a fixed VID-determined output voltage is energy inefficient due to its inability to track voltage fluctuations. The reference voltage 304 for the circuit in FIG. 3 will typically need to be set higher in order to compensate for the voltage fluctuations and to ensure that the processor is receiving a minimum voltage to support the frequency on which it is operating. For example, if the processor needs at least 1 Volt to run at 1 GHz, and the voltage ripple is 0.1 V, the reference voltage will need to be set at 1.1 V in order to ensure a minimum voltage of 1 V is provided to the processor to run at 1 GHz. As a result, an additional power cost needs to be paid to compensate for this voltage fluctuation.

By comparison, embodiments of the present invention avoid the power cost by using a Dynamic voltage Controlled Oscillator (DVCO) and a comparator 515 to tie the frequency that the processor is running at with the voltage. Embodiments of the present invention, therefore, eliminate the VID code completely and instead use the desired frequency of operation as the input parameter to the regulator control logic. The desired frequency of operation is entered using the target frequency 550 input parameter. PLL 574 is used to convert the target frequency value that is inputted into a clock signal that is fed into comparator module 515 using reference clock 551 (which may be indicative of the time period over which to make the comparison). The desired frequency of operation is determined by the software applications running on the processor. For example, if a processor-intensive application is being run on the processor, a higher target frequency 550 will be requested by the application.

To achieve best performance for a given power envelope, the chip needs to run at the maximum frequency it can achieve at a given voltage. In the circuit illustrated in FIG. 5, the software application has to request a voltage from the regulator and based on that voltage, request the maximum safe frequency at that voltage from the DVCO. However, due to regulator tolerances, there could be drift in regulator voltage and the frequency needs to be margined for this drift. In the scheme proposed in the embodiment of FIG. 5, instead of requesting a voltage from the regulator, a frequency can be requested from the DVCO using target frequency parameter 550. If the DVCO 514 achieves the exact frequency of the request, then the loop is stable. However, if the DVCO frequency is different from the requested frequency, the comparator 515 determines the frequency error 509 which is fed to the PID 507 in feedback.

The PID converts the frequency error into a duty cycle adjustment, which then controls the output voltage VREG 526 of the integrated regulator directly. The change in voltage changes the DVCO frequency until it is the same as the software application requested frequency. Unlike the conventional approach illustrated in FIG. 3, the embodiment of the invention presented in FIG. 5 does not have similar issues with regulator voltage request quantization and also regulator tolerances. Because embodiments of the present invention request a duty cycle instead of a voltage, they are not subject to any voltage granularity issues like the prior art design. Thus, the design of FIG. 5 eliminates any potential voltage error due to regulator tolerances, regulator granularity etc.

As mentioned in the DVCO application, the clock generating circuit disclosed therein tracks an integrated circuit's critical path across process, voltage and temperature variation. Such a clock generating circuit enables higher performance when conditions allow, in comparison to the conventional art. In addition, the approach disclosed therein produces a variable clock signal, for example, a clock signal that changes frequency according to manufacturing variations and/or operating conditions. Such a variable clock signal is in contrast to the conventional art, which has strived for a very stable, e.g., crystal-controlled, clock signal that does not vary with manufacturing variations and/or operating conditions. Accordingly, by using the DVCO described in the aforementioned DVCO application, the voltage regulating system shown in FIG. 5 can compensate for process, temperature and aging variations as well.

Further, as shown in FIG. 5, the DVCO module 514 takes a voltage value, VREG 526 (which is the voltage that the processor is operating at), as an input and outputs a frequency that is tied to the input voltage. The outputted frequency 527 from the DVCO module 514 is compared to the frequency outputted by PLL module 574 using comparator module 515. It should be noted that clock dividers may be used to divide the frequency 527 and the output of PLL 574 before inputting them into comparator module 515. The frequency error 509 determined by the comparator module 515 is then fed to PID 507 controller to generate a duty cycle control signal which is fed to a digital pulse-width modulation block (DPWM) 508 to generate a periodic waveform (VPWM) 510 with the desired duty cycle using the Power FETs 580. VPWM is used to switch the discrete inductor 511 periodically to either a high-voltage (VDDH) or ground to generate the desired output voltage, VREG 526. In this way, the embodiment of FIG. 5 dispenses with the additional step of requesting a voltage that is converted to a frequency and then converted back to a voltage (as in the design of FIG. 3).

Also, not having a reference voltage 304 (as in the design of FIG. 3) addresses the voltage ripple issue because the reference voltage, which may ripple, is instead replaced by a frequency request through parameter 550. In addition, removing analog components such as A/D converter 304 (and its corresponding analog inputs, e.g., Vref 304) and PID 307 with digital components also helps to eliminate extra voltage noise in the circuit.

The DVCO 514 is operable to tie the voltage of the processor to the frequency of the processor. The input voltage of DVCO 514 is VREG 526, which is the same voltage at which the processor is running. Further, the output frequency of DVCO 514 is also the frequency at which the processor runs. In other words, the output of DVCO is used as the system clock in this embodiment. By tying the voltage and frequency of the processor together, the voltage ripple issue is eliminated because if the voltage 526 fluctuates due to ripple, the frequency 527 at the output of the DVCO 514 will fluctuate as well. For example, if the voltage 526 increases, the processor frequency 527 outputted by the DVCO will also increase to accommodate the higher voltage requirements. Accordingly, unlike the scheme illustrated in FIG. 3, no additional power cost needs to be paid to compensate for a voltage fluctuation.

If a software application being run on the processor requests a different frequency, the request is made using target frequency input 550. The PLL 574 converts the numerical value into a clock frequency and the comparator module 515 determines the frequency delta between frequency 527 and the output of PLL 574. This is then converted to a periodic waveform (VPWM) 510 with the desired duty cycle using the Power FETs 580, which then produces the desired output voltage, VREG 526, as discussed above. Accordingly, the system shown in FIG. 5 is simply a closed feedback loop with a frequency request. Further, by tying the voltage 526 to the frequency 527, the system settles on its own. This eliminates the VID code of FIG. 3 and the power cost associated with setting the reference voltage 304 to a higher value in order to compensate for any voltage noise issues that may arise.

Figure 6:
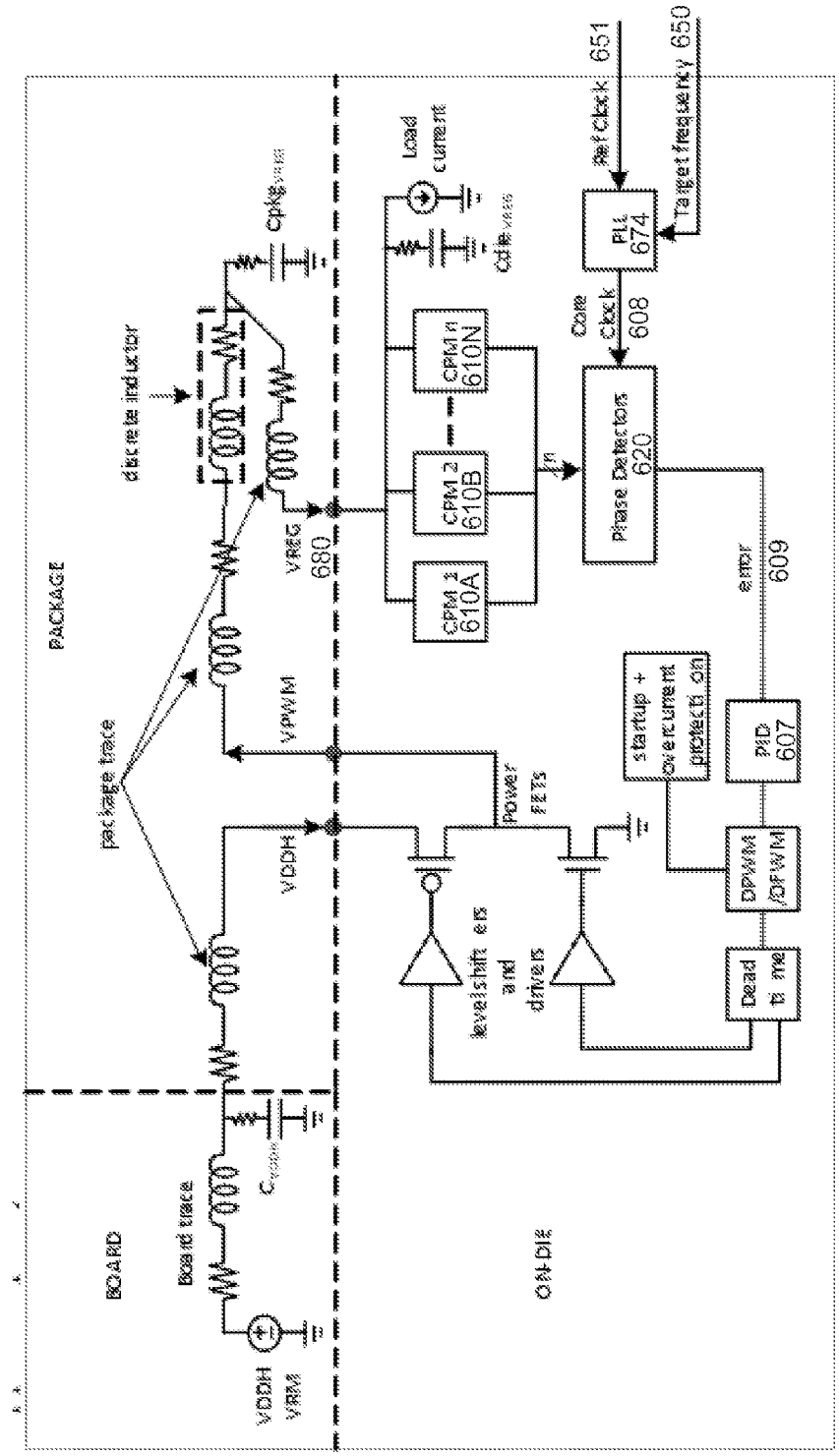
FIG. 6 illustrates a process, temperature, voltage and aging tolerant feedback control for voltage regulators in accordance with an embodiment of the present invention.

FIG. 6 illustrates a process, temperature, voltage and aging tolerant feedback control for voltage regulators in accordance with an embodiment of the present invention. As shown in FIG. 6, the proposed regulator consists of multiple critical path monitors (CPMs) (610A, 610B . . . 610N) in its feedback path whose delays are compared against the reference PLL clock 608 to generate an error signal 609. Similar to FIG. 5, PLL module 674 is used to convert the target frequency numerical value 650 into a frequency 608 using reference clock 651 (as stated above, the reference clock may be indicative of a time period). In one embodiment, the DVCO circuit 514 and comparator module 515 of FIG. 5 can also be used in place of the PLL 674 circuit shown in FIG. 6 to perform the same function.

In this embodiment, the voltage is not tied to the frequency as in FIG. 5. Instead, the clock signal 608 is simply used as a monitor. A fixed frequency may be requested through target frequency input parameter 650. The PLL 674 converts this numerical value into a fixed clock frequency 608 that is used to clock the rest of the chip including the CPM circuits. Voltage VREG 680, which is being used to run the CPM circuits, can then be reduced until right before one of the critical path monitors 610A to 610N signals a fail signal. In other words, the processor voltage 680 in this embodiment is reduced until right before a failure may be observed at one of the critical path monitors, 610A to 610N. Subsequently, the processor is run at the lowest possible voltage at a threshold right before a failure may occur. An OR gate can be used to flag an error if any of the inputs from the CPMs 610A to 610N experience a critical failure. Accordingly, the voltage is this embodiment is not tied to frequency. Instead, the voltage is adjusted at a given fixed frequency until right before a critical threshold is reached where one of the critical paths fail.

The comparison can be performed using an array of phase detectors 620, or other well-known digital techniques. This is in lieu of having an A/D converter to compare the output voltage to a fixed voltage reference (as shown in FIG. 3). The rest of the control logic remains the same as in the circuit shown in FIG. 5, e.g., PID controller 607 is used to generate the duty cycle control signal using error signal 609. Having CPMs 610A to 610N in the feedback loop allows for continuous adjustment of output voltage such that the worst CPM path always meets the target operating frequency across all temperature and aging variations. For instance, as the transistors in a CPM degrade and the delay of the CPM increases, the regulator correspondingly increases the output regulated voltage to allow correct operation at the shipped frequency.

The CPMs 610A to 610N can be composed of different critical path replica canary circuits or may consist of in-situ critical path delay monitors. It is important to reduce the margin required due to the difference in delays of CPMs across all PVT corners and aging scenarios. In order to ensure reliability and robustness, a low and a high-limit (Vmin and Vmax) is applied to the system. The operating system or the power management unit should not request a frequency high enough which requires the regulated voltage to exceed the Vmax of the system. Similarly, the regulated voltage should never drop below the Vmin limit at very low operating frequencies to ensure enough voltage headroom for correct circuit operation.

Figure 7:
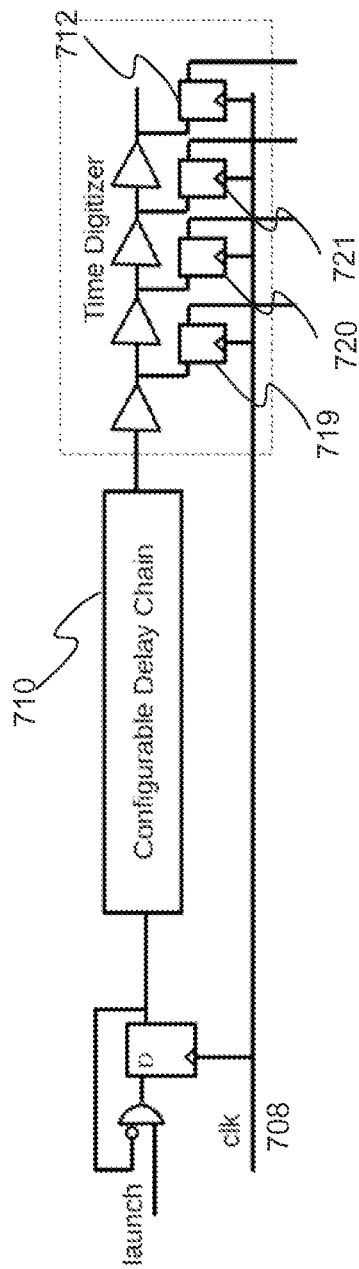
FIG. 7 illustrates the manner in which the delays of the critical path monitors (CPMs) illustrated in FIG. 6 can be compared against the reference PLL clock to generate an error signal.

FIG. 7 illustrates the manner in which the delays of the CPMs illustrated in FIG. 6 can be compared against the reference PLL clock to generate an error signal. Assuming clock 708 in FIG. 7 is the PLL clock and configurable delay chain 710 is the critical path, if the critical path delay is smaller than the clock period, then the receiving flop(s) 712 at the end will capture the right value. If the critical path is slower than the clock period, then the receiving flop(s) will capture the wrong value. Accordingly, based on the value captured in the receiving flop(s), a determination can be made as to whether the clock 708 is too fast for the critical path. The extra flops at the end of the path (e.g., flops 720, 721, 712) are to signal when the path is about to fail. For example, if the right most flop 712 fails but the left most one 719 does not, it indicates that a failure is close to taking place but has not yet. Accordingly, the canary paths illustrated in FIG. 7 can signal a failure before the circuit actually fails.

The digital feedback as illustrated in FIG. 6 helps reduce the binning time of devices as it automatically adjusts the regulated voltage based on the inherent silicon speed of the critical paths. The devices can be coarsely binned for shipping frequency based on representative ring-oscillator or CPM speeds. The proposed feedback control can further fine-tune the system to the minimum voltage required to meet the target frequency. Accordingly, embodiments of the present invention can reduce the binning time and alleviate binning margins by fine-tuning the voltage of devices within a coarse bin.

The digital feedback approach illustrated in FIG. 6 has several advantages. As mentioned above, it eliminates VID decoders and optimally generates the minimum supply voltage required for current operation at the target frequency. This, in general, results in higher energy efficiency and improved battery life. The circuit of FIG. 6 also compensates for critical path delay variations due to changes in temperature during runtime. Further, it compensates for critical path delay increases due to transistor speed degradation due to aging.

Embodiments of the present invention also take into account the critical path delay sensitivity to supply voltage while compensating for low-frequency supply fluctuations where supply noise frequency is lower than the closed loop bandwidth of the regulator control.

It should be noted that while some prior art systems employ temperature and aging compensator circuits in series with the voltage regulator module, embodiments of the present invention are more area-efficient as they incorporate these compensator circuits in the feedback loop in the VRM, which obviates the need of an area-intensive A/D converter. Having the compensator in the feedback loop of the regulator also results in lower latency of compensation.

Figure 8:
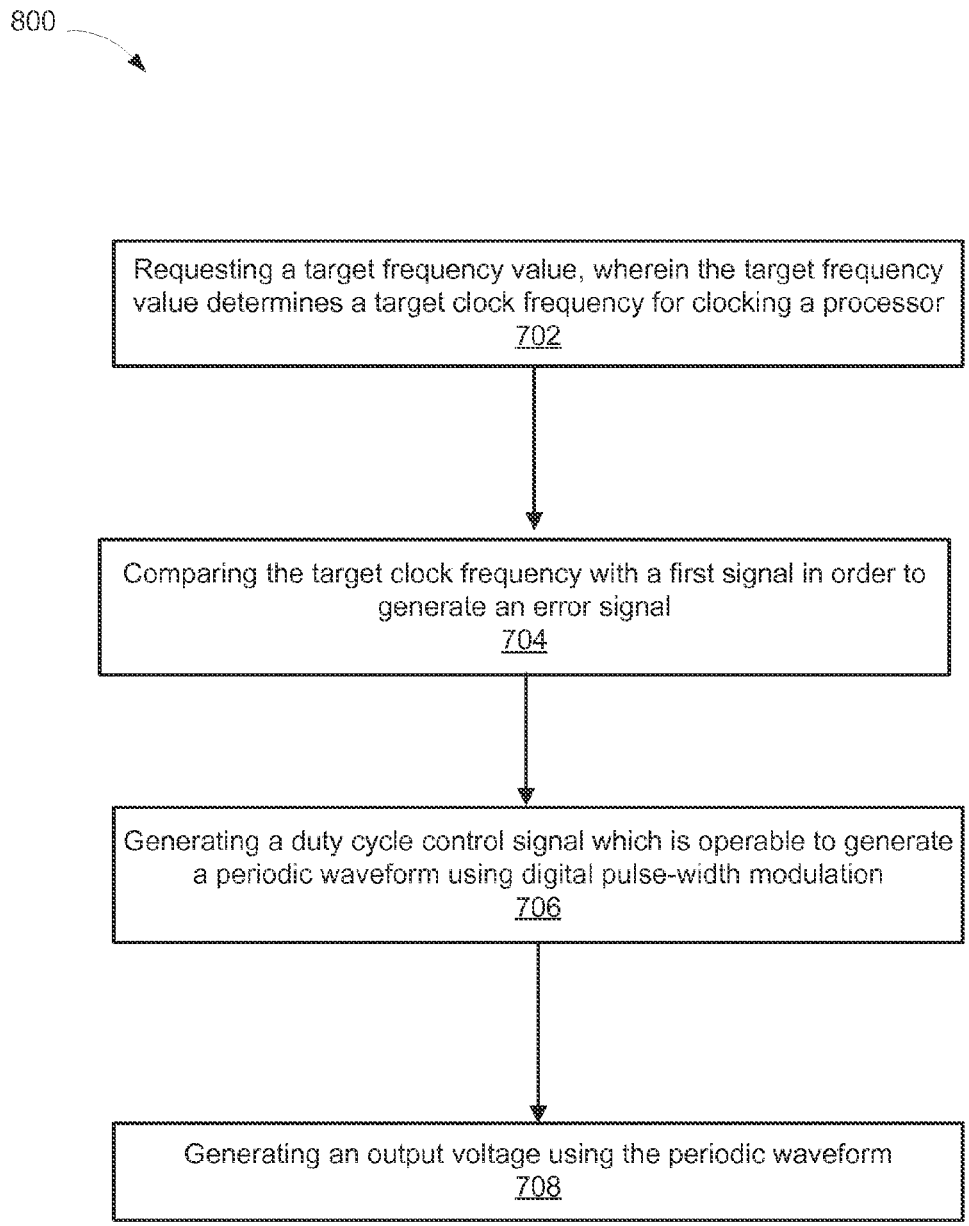
FIG. 8 depicts a flowchart of an exemplary process of regulating voltage that compensates for process variations, voltage variations, temperature variations and aging in accordance with one embodiment of the present invention.

FIG. 8 depicts a flowchart of an exemplary process of regulating voltage that compensates for process variations, voltage variations, temperature variations and aging in accordance with one embodiment of the present invention.

At step 802, a target frequency is requested, wherein the target frequency value determines a frequency for clocking a processor. For example, as shown in FIGS. 5 and 6, and explained above, in comparison to conventional VRMs, embodiments of the present invention request a target frequency value (e.g., through inputs 550 and 650) instead of a voltage value using VIDs.

At step 804, the target clock frequency is compared to a first signal in order to generate an error signal. For example, in the embodiment of FIG. 5, the first signal is an output of the DVCO 514, which indicates the frequency at which the processor is currently operating. In the embodiment of FIG. 6, the target clock frequency 608 is compared to the delays from the critical path monitors 610A to 610N using phase detectors 620 to generate an error signal 609.

At step 806, a duty cycle control signal is generated, which is operable to generate a periodic waveform using digital pulse-width modulation. As discussed above, the error signal 509 or 609 is used to generate a duty cycle control signal using a PID controller 507 or 607 respectively.

At step 808, the periodic waveform is used to switch the discrete inductor, e.g., inductor 511 periodically to either a high-voltage (VDDH) or ground to generate the desired output voltage, VREG.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only.

For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method for regulating voltage for a processor, said method comprising:
   requesting a target frequency value, wherein the target frequency value determines a target clock frequency for clocking the processor;
   comparing the target clock frequency to a first signal to generate an error signal;
   using the error signal, generating a duty cycle control signal, wherein the duty cycle control signal is operable to generate a periodic waveform; and
   generating an output regulator voltage using the periodic waveform, wherein the output voltage is operable to provide power to the processor.

2. The method of claim 1, further comprising:
   providing the output voltage as an input to a dynamic voltage controlled oscillator.

3. The method of claim 2, wherein the dynamic voltage controlled oscillator generates the first signal, wherein the first signal is a clock signal with a first frequency, wherein the first frequency is an operating frequency of the processor, and wherein the first frequency is directly related to the output regulator voltage.

4. The method of claim 1, further comprising:
compensating the error signal through a proportional-integral-derivative (PID) controller to generate the duty cycle control signal; and
generating the periodic waveform from the duty cycle control signal using digital pulse-width modulation and power FETs.

5. The method of claim 1, wherein the requesting a target frequency value comprises a software application running on the processor requesting the target frequency value.

6. The method of claim 1, further comprising:
providing the output regulator voltage as an input to a critical path monitoring circuit, wherein the target clock frequency is not tied to the output regulator voltage, and wherein further the first signal is a delay value from the critical path monitoring circuit.

7. The method of claim 6, wherein the comparing is performed by a phase detector.

8. The method of claim 7, further comprising:
adjusting the output regulator voltage wherein the critical path monitoring circuit maintains the target clock frequency across all temperature and aging variations.

9. An apparatus for regulating processor voltage, said apparatus comprising:
a comparator, having a first input operable to be set at a target frequency value, and wherein the target frequency value determines a target clock frequency for clocking a processor;
a dynamic voltage controlled oscillator (DVCO) operable to generate a clock signal with a first frequency, wherein the first frequency is an operating frequency of the processor and is a second input to the comparator, wherein the first frequency is a function of the output regulator voltage, wherein the DVCO is powered by the output regulator voltage, and wherein the first frequency is compared with the target clock frequency using the comparator to generate an error signal; and
a circuit operable to generate an output regulator voltage using the error signal, wherein the output regulator voltage is operable to supply power to the processor.

10. The apparatus of claim 9, wherein the circuit comprises:
a proportional-integral-derivative (PID) controller operable to compensate the error signal to generate a duty cycle control signal.

11. The apparatus of claim 10, wherein the circuit further comprises:
a digital pulse-width modulation block and a pair of power FETs operable to convert the duty cycle control signal into a periodic waveform.

12. The apparatus of claim 11, wherein the circuit further comprises:
a discrete inductor, wherein the periodic waveform is operable to periodically switch the discrete inductor in order to generate the output regulator voltage.

13. The apparatus of claim 9, wherein the target frequency value originates from a software application running on the processor.

14. The apparatus of claim 9, wherein the target frequency value is converted to the target clock frequency using a phase-locked loop (PLL) module.

* * * * *